United States Patent
Brodsky et al.

(10) Patent No.: US 6,639,661 B2
(45) Date of Patent: Oct. 28, 2003

(54) TECHNIQUE FOR IMAGING ELECTRICAL CONTACTS

(75) Inventors: William L. Brodsky, Binghamton, NY (US); Lawrence P. Lehman, Endicott, NY (US); Daniel C. Van Hart, Conklin, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 09/756,325

(22) Filed: Jan. 8, 2001

(65) Prior Publication Data

US 2002/0089663 A1 Jul. 11, 2002

(51) Int. Cl.$^7$ ............................................... G01N 21/00
(52) U.S. Cl. .................................. 356/237.2; 356/237.5
(58) Field of Search ............................... 355/53, 72–76; 356/399–401, 237.2, 237.3, 237.4, 237.5, 244; 310/10, 12; 378/34–35

(56) References Cited

U.S. PATENT DOCUMENTS

| | | | |
|---|---|---|---|
| 4,728,186 A | 3/1988 | Eguchi et al. | |
| 4,833,051 A * | 5/1989 | Imamura | 430/5 |
| 5,450,206 A | 9/1995 | Caillat et al. | |
| 5,465,152 A | 11/1995 | Bilodeau et al. | |
| 5,621,530 A | 4/1997 | Marrable, Jr. | |
| 5,734,475 A | 3/1998 | Pai | |
| 6,496,248 B2 * | 12/2002 | Tanaka | 355/72 |

* cited by examiner

Primary Examiner—Russell Adams
Assistant Examiner—Michele P. Nguyen
(74) Attorney, Agent, or Firm—Douglas M. Clarkson

(57) ABSTRACT

A congruence between the element that provides an electrical conductive path in a component of micron dimensions and an imaging of that element provides a basis for predicting the effectiveness and the consistency in the functioning of the element in an actual operating environment. The element is formed first into a sandwich whereby the operating end is deformed against a light transparent surface. By directing a beam of light into the end of that light transparent surface, the asperity of the operating end produces a light scattering effect that is imaged by microscopic optics that is located facing the operating end.

23 Claims, 1 Drawing Sheet

TECHNIQUE FOR IMAGING ELECTRICAL CONTACTS

The writing, the subject matter, and the description presented herein is protected under the provisions of United States Copyright laws by the Assignee, International Business Machines Corporation, except only to any extent required by law in order to obtain and to continue all patent protection that is available during the term of any patent that issues hereon.

BACKGROUND OF THE INVENTION

1. Field of the Invention

The present invention, generally, relates to a technique for imaging an area in contact with a reference surface and, more particularly, to imaging an area with objects of interest having a length scale measurement in microns.

Clearly, the technique of the present invention includes a principal optics, such as possibly but not necessarily a microscope which adds an unanticipated complication. For a microscope type of viewing optics to be effective in forming a useful image, it must involve sufficient light gathering power, and the present invention provides a solution to this complication also.

2. Description of the Prior Art

U.S. Pat. No. 5,734,475 to Pai dated Mar. 31, 1998 describes measuring the density of elements on a wiring board by directing a light to obtain a distance from a reference plane.

U.S. Pat. No. 5,621,530 to Marrable, Jr. dated Apr. 15, 1997 describes measuring distance by directing light between two mirror surfaces arranged at angles and a flat transparent surface.

U.S. Pat. No. 5,465,152 to Bilodeau et al. dated Nov. 7, 1995 describes a method of measuring coplanarity of an array of elements using reflected radiation and 3-D optical sensing.

U.S. Pat. No. 5,450,206 to Caillat et al. dated Sep. 12, 1995 describes using a light beam reflected from balls on a chip and determining conformity of the reflected beam.

U.S. Pat. No. 4,728,186 to Eguchi et al. dated Mar. 1, 1988 describes obtaining data on an uneven surface in contact with a transparent plate using light reflected through the plate.

While at first appearance, the techniques, the apparatus and the methods described in these prior patents have similarities with the present invention, they differ in material respects. These differences, which will be described in more detail presently, are important for the effective use of the invention to achieve the various advantages it provides.

OBJECTS AND SUMMARY OF THE INVENTION

It is an important object of the present invention to provide a technique that permits obtaining a dramatic improvement in the resolution of detail of a contact surface.

It is also an object of the invention to provide a technique to distinguish differences in contact body hardness.

Briefly, an examination of electrical contacts requires determining the number and the distribution of the contact points available for contact. In today's equipment, this determination involves contact asperity of micron dimensions or less. The contact is pressed against an optical surface while viewing the contact permitting contact points to be imaged and measured.

The above and other objects, features and advantages of the present invention will become more readily apparent as the detailed description of the presently preferred embodiment proceeds.

BRIEF DESCRIPTION OF THE DRAWINGS

For a fuller understanding of the nature and objects of the present invention, reference is made to the following detailed description taken in conjunction with the accompanying drawings, in which.

DETAILED DESCRIPTION

Figure 2:
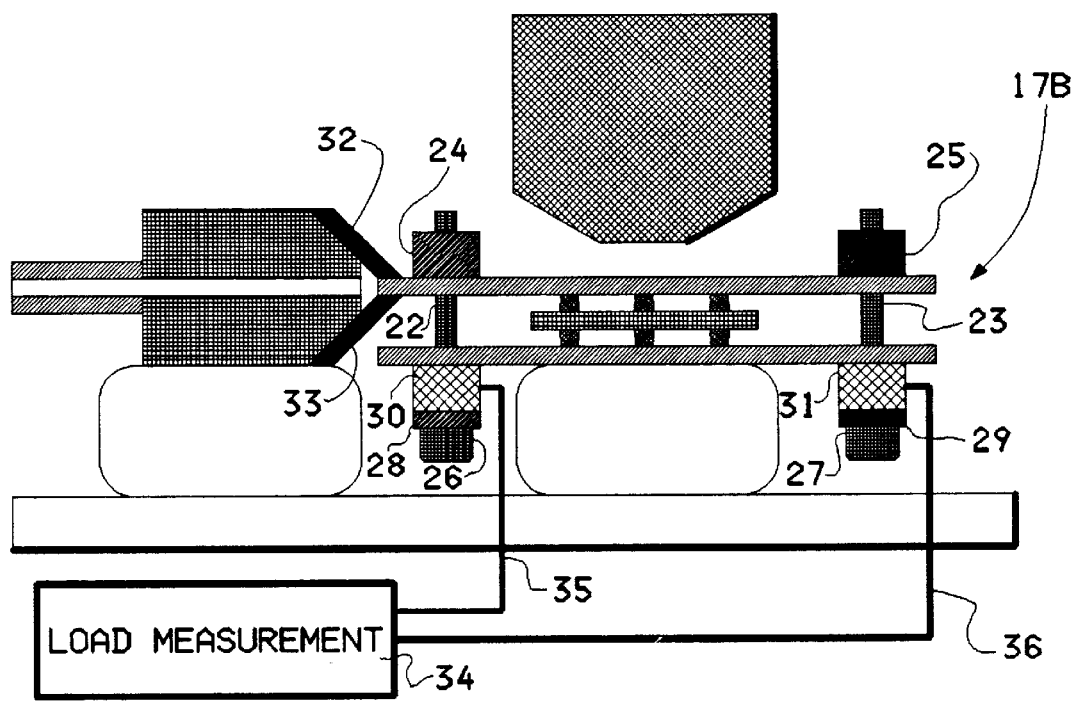
FIG. 2 illustrates features permitting a control of a variable force as an aid in describing the present invention.

In today's rapid developing technology, component parts are being required in smaller and smaller dimensions. Some of these measure in "microns". To maintain perspective and to develop an understanding and appreciation for the challenges involved in the present invention, a millimeter is 0.001 meters, whereas a micron is one thousandths of a millimeter.

Component parts of these dimensions that involve movement already are presenting formidable challenges. Electrical circuits are formed of conductors that are connected by electrical contacts that provide paths for electric current flow from one electrical conductor to another at applied voltages.

Understanding the problems solved by the present invention are still not appreciated without considering the size of the electric circuits, some of which could fit on the head of a pin. Possibly a few of the challenges that today's technology involves can be both understood and appreciated based on these factors.

Now, an electrical voltage can be defined as the "push" behind an electric current. As the physical dimensions of the components have reduced and the density of the components increased, operating voltages have decreased. There is a voltage threshold, however, in making a digital signal change from a "0" to a "1" and vice versa. Therefore, it is critical for electrical contacts used in such circuits to be consistent in their performance.

During the manufacture of electrical contacts, microscopic asperity develops on contact surfaces. During mating of contact surfaces in such electrical circuits, the connection is actually formed at these asperity spots, which are metallic, and the size and the distribution of the asperity spots influences electrical resistance and the current carrying capacity of the electrical contact.

While the method of manufacturing electrical contacts forms no part of the present invention, the technique of the invention permits viewing, counting and measuring each contact surface. With this information, problems are predicted and avoided by correction.

The present invention is a technique for imaging a contact surface with a resolution as small as the micron scale in order to study and measure such irregularities. Since the small sizes involved in the contact surfaces has been described in substantial detail, further reference to the fact of their size is considered unnecessary.

The same reference numerals are used throughout the several views to identify the same or comparable components.

A current or preferred application of the present invention will be described in the following description.

The application being described is the imagery of Land Grid Array contact system where the contacts are comprised of a conductive particle filed silicone elastomer of commercial manufacture. The conductive particle fillers consist of metallic particles such as silver (Ag).

It is understood that the present invention is not limited to this application and can be adapted to image the asperities on conventional metallic contact interfaces.

It is also understood that contact surfaces, though described in reference to electrical contacts, applies to other areas of engineering science such as: heat transfer surfaces, optical interfaces, etc.

Figure 1:
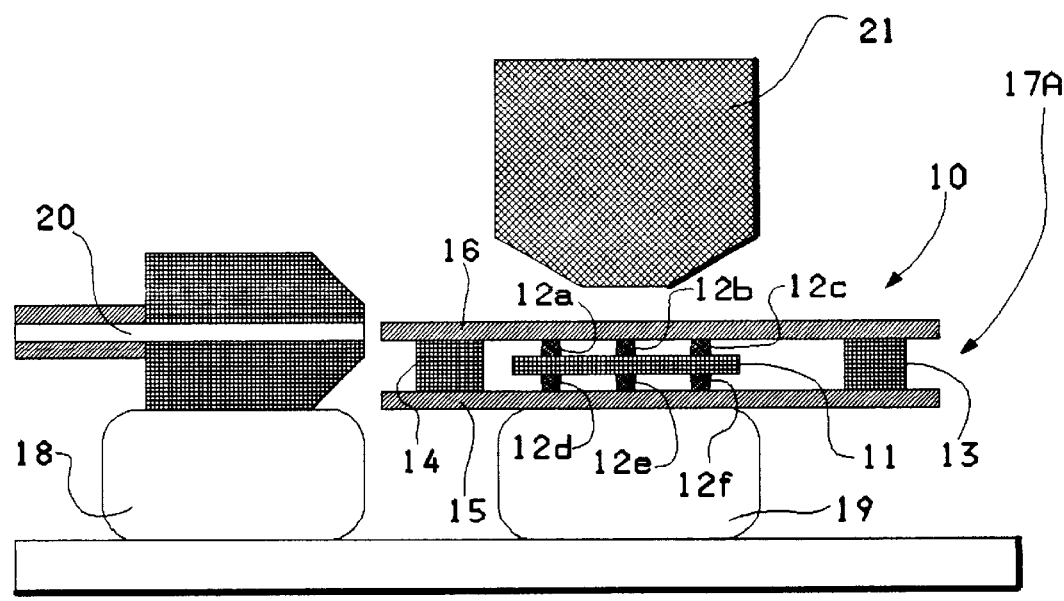
FIG. 1 is an illustration of features as an aid in describing the present invention.

Referring now to FIG. 1 of the drawings, the technique of the present invention is indicated generally by the numeral 10. The numeral 11 identifies generally a carrier, formed of insulating material, such as Mylar, for example, to prevent electrical conduction between three contacts 12a, 12b and 12c that extend through the carrier 11 to provide contact surfaces 12d, 12e and 12f on one end for making electrical connection with a surface with which it will mate.

The opposite end of the three contacts 12a, 12b and 12c provide contact surfaces that can also be imaged with the technique of the present invention by inverting, or flipping, the carrier 11 over, which will be described presently.

The contacts 12a–c are Land Grid Array (LGA) connectors that are used to make contact or establish a connection between various electrical components or devices that form no part of the present invention. It is the opposite ends of each contact 12 that form a surface which will be imaged for study by the present technique.

Each of the contacts 12a–12c is only in the order of 0.020 of one inch in diameter, and they are manufactured usually in quantity of about 900 to 5000 per LGA. In use, it is important for them to be capable of functioning effectively and consistently.

Clearly a contact can be imaged individually and separately by the present invention. For example, the carrier 11 with the contact surfaces 12d–12f on one side is selected for evaluation in the position shown in FIG. 1.

Next, as shown in FIG. 1, two shims 13 and 14 are affixed to one side of a relatively thin glass surface 15, using any type of adhesive (a type available commercially and called "super glue" is entirely satisfactory). This same adhesive is applied to the shims on their opposite sides to affix a second thin glass surface 16, as will now be described.

With the contacts to be imaged 12a–12c placed on the surface 15 between the two shims 13 and 14, a second glass surface 16 is located over, and also resting on the opposite ends of surface 12a–12c the contacts are compressed until the glass members 15 and 16 contact shims 13 and 14. The thickness of the shims 13 and 14 is equal to the final compressed height of the contacts 12, the difference in original height and shim height generating contact normal force.

With the glass surface 16 in place, a dead weight of between 20 and 150 grams per contact is placed on it to press the surfaces 15 and 16 and the shims 13 and 14 together until the glue cures forming a sample 17A that includes the carrier 11 and contacts 12.

Glass was selected as the material of which the surfaces 15 and 16 are formed because it is effective as a light guide and it provides a thin, firm, flat surface against which the contacts 12 can be pressed and deformed for evaluating the contact asperities (roughness, unevenness). In contacts asperities of the contacts 12 mating against a reference surface which ultimately form the electrical conductive path may have micron dimensions.

An important property of lightguides 15 and 16 is to maintain near totally internally reflected light in the contact imagery region. The contact (12) asperities being imaged by this invention disturbs the outside surface of the lightguide, reflecting the light source such that light rays exit the lightguide surfaces providing an image of the contact asperities.

With the contacts 12 pressed firmly between the surfaces 15 and 16, the asperities can be evaluated by the following procedure. It is the asperities deforming against the surfaces 15 and 16 that has been discovered to produce a light scattering effect that can be used to produce an image of the deforming asperities.

The congruence between the mechanism of forming a conductive path and the mechanism of imaging a contact surface that has been discovered to provide the power and the novelty of this technique.

The sample 17A is supported, as indicated generally by the reference numeral 19, so that a light beam 20 supported by 18 is directed at an end of the surface 16 will travel to encounter the contacts 12 in their deformed condition, as just described, at oblique angles and so that it is reflected and collected by an objective lens of an optical microscope, indicated generally by the numeral 21.

To provide the light beam 20 into the end of thin surface 16, the beam should be formed in a thin collimated pattern also, and there are many light sources available commercially that do this. Of course, the light beam 20 can be augmented by additional light sources if more light is needed in any particular instance.

In accordance with the present invention, it is the deformed asperities of the contacts 12 that provide these image features in this micron scale. Therefore, it may take some trials to achieve an optimum reflection that can be recorded or photographed.

In tests of the invention, an ordinary incandescent light with fiber optic cable to collimate the light was used and determined to be entirely adequate in most instances. An optical microscope, therefore, is the primary imaging optics 21 in the present invention.

The imaging optics 21 can be any type that is capable of enlarging a feature by 100 to 1000 times. There are many types of microscopes available commercially that are satisfactory for use with the technique of the present invention. An example would be those provided by Nikon and Ziess, and there are others.

In FIG. 2 of the drawings, a way is illustrated to use the technique of the present invention to vary the applied force on a contact 12 and to provide an indication of the force. Instead of shims, threaded bolts 22 and 23 with nuts 24 and 25 on one end and nuts 26 and 27 with washers 28 and 29 on the other end are used, so that a predetermined force is applied on the test contacts, instead of a predetermined deflection.

The predetermined force being applied from nuts 26 and 27 to washers 28 and 29, the washers acting on load cells 30 and 31 used to indicate the applied force by such devices as, for example, straingages configured in a Wheatstone Bridge, which would draw no electric current near the clips and, therefore, will produce no heat. The applied force measured by load cells 30 and 31 being indicated on meter 34 as typically used with load cells.

When it is desired to change the applied force on the contacts 12, an adjustment is made by turning one of the nuts 24, 25, 26 or 27 until the desired applied force is observed by a device 34, that is labeled "load measurement". For this reason, the particular nut 24 through 27 that is adjusted can be termed "load control".

There is an additional advantage provided by the present invention that has been largely unavailable in the past, and that concerns information relating to contact hardness. For the current description, the metal particles of higher density or hardness in the contact material that deform the thin transparent material against which the contacts are forced and can be distinguished from the siloxene matrix material at the contact interface surface.

In these small contacts, it is these metal particles that are the primary conveyors of electric charges. By the technique of the present invention, these metal particles, their number, dimensions and other characteristics can be viewed, counted and examined.

For example, information relating to hardness can be obtained, which is extremely important in their manufacture, by an adjustment to the applied force or "load" that deforms the contacts 12 against the glass surfaces 15 and 16 illustrated in the figures. It is the discovery that this information is related to contact hardness that adds to the power and novelty of the present technique.

To repeat for emphasis, the light beam 20 is reflected from a contact 12 and is viewed and/or recorded at approximately a ninety degree angle by the microscopic optics 21. This makes a study of the contact possible, producing information that is useful in the manufacture of consistent and reliable operating contacts.

At any time when interference develops either from the light beam 20 scattering or from a problem with ambient light, suitable light baffles 32 and 33 are added, as illustrated, to direct and to focus the light beam 20 as it is directed at the end of sample 17B.

There are two wires 35 and 36 that connect the device 34 that is labeled "Load Measurement" with the load cells 30 and 31. By the use of the load measurement feature, those contacts that are expected to function effectively and consistently at a given force or within a particular force range can be tested with accuracy.

Therefore, the technique of the invention permits imaging the contacts 12 with maximum efficiency in time, effort and convenience while maintaining maximum accuracy. This information is beneficial to the design and manufacturing efforts for electrical contacts and other applications where surface asperities are critical, and when available, permits achieving a significant saving in manufacturing costs.

Having described the technique of the invention in detail with its use to achieve a maximum efficiency as a time saving operation, as well as a maximum of ease, while achieving imaging contacts in micron scale dimensions, the study, inspection and imaging of other surfaces will become apparent to those skilled in the art.

It will be apparent to those skilled in the art that other changes may be made in the technique that is described. This invention, therefore, is intended to be limited only by the appended claims.

What is claimed is:

1. A technique for imaging a surface of a contact, which surface has asperities of micron dimensions, comprising:
   locating said contact with said surface with asperities on a first surface of a predetermined material with said asperities facing away from said first surface;
   positioning a second surface of a predetermined length and width wits at least one edge and formed of a predetermined transparent material over said contact surface having said asperities;
   affixing said first and second surfaces together to apply a predetermined force to deform said contact surface having said as asperities against said second surface;
   applying a light source to at least one end of said second, transparent surface for reflecting from said asperities; and
   using optical means for imaging said light reflected from said asperities.

2. A technique for imaging a surface of a contact, which surface has asperities of micron dimensions as described by claim 1, including supporting said first and second surfaces with said contact having asperities to keep said first surface level.

3. A technique for imaging a surface having asperities of micron dimensions, as described by claim 1, including using shim means located between said first surface and said second surface to limit contact deflection.

4. A technique for imaging a surface having asperities of micron dimension as described by claim 1, including using a plurality of said contacts with asperities between said first and second surfaces.

5. A technique for imaging a surface having asperities of micron dimensions as described by claim 4, wherein said plurality of said contacts have surfaces with asperities on a first side and on a second side.

6. A technique for imaging a surface having asperities of micron dimensions as described by claim 1, wherein said second surface formed of a predetermined transparent material is formed of a microscope slide material.

7. A technique for imaging a surface having asperities of micron dimensions as described by claim 1, wherein said force to deform said contact surface having asperities is in the order of 30 grams per contact.

8. A technique for imaging a surface having asperities of micron dimensions as described by claim 1, wherein said force to deform said contact surface having asperities is in a range of 20 grams to 150 grams.

9. A technique for imaging a surface having asperities of micron dimensions as described by claim 1, wherein said optical means is an optical microscope.

10. A technique for imaging a surface having asperities of micron dimensions as described by claim 1, wherein said light source is positioned at an angle relative to said optical means of substantially 90 degrees.

11. A technique for imaging a surface having asperities of micron dimensions as described by claim 1, wherein said affixing said first and second surfaces together includes using load control means for adjusting said predetermined force to deform said contact surface.

12. A technique for imaging a surface having asperities of micron dimensions as described by claim 11, wherein said affixing said first and second surfaces together includes using bolt and nut means spaced apart between said first and second surfaces.

13. A technique for imaging a surface having asperities of micron dimensions as described by claim 11, wherein said affixing said first and second surfaces together includes using bolt and nut means spaced apart on each side of said contact surface having asperities, and using means to indicate said applied force.

14. A technique for imaging a surface having asperities of micron dimensions as described by claim 11, wherein said affixing said first and second surfaces together includes using load control means spaced apart between said first and second surfaces.

15. A technique for imaging a selected surface having asperities of micron dimensions that is attached to carrier means supporting a plurality of similar contact surfaces, comprising:
   locating said carrier means on a first surface of a predetermined material with said selected surface to be imaged facing away from said first surface;

positioning a second surface of a predetermined length and width with two ends and formed of a predetermined transparent material over said selected surface to be imaged;

affixing said first and second surfaces together to apply a predetermined force to deform said selected surface having asperities against said second surface;

applying a light source to at least one end of said second, transparent surface for reflecting from said asperites; and using optical means for imaging said light reflected from said asperities.

16. A technique for imaging a surface having asperities of micron dimensions as described by claim 15, including supporting said carrier means and said first and second surfaces to keep said selected contact surface level.

17. A technique for imaging a surface having asperities of micron dimensions as described by claim 15, wherein said optical means is an optical microscope.

18. A technique for imaging a contact having asperities of micron dimensions as described by claim 15, wherein said carrier means supports a plurality of contacts each having a first surface on one side and a second surface on an opposite side.

19. A technique for imaging a surface having asperities of micron dimensions as described by claim 15, including load control means to vary said force to a predetermined value.

20. A technique for imaging electrical contact surfaces having asperities of micron dimensions that are attached to carrier means supporting a plurality of electrical contacts with first surfaces on one side and with second surfaces on the opposite side, comprising:

selecting a first surface and a second surface formed of a transparent microscope slide material, said selected surfaces having predetermined length, width and two ends;

locating said carrier means on said first selected surface with said plurality of contact surfaces facing away from said firs selected surface;

positioning a second surface of a predetermined length, width and two ends over said plurality of contact surfaces that face away from said first surface;

affixing said first surface and second surface together to apply a predetermined, adjustable force to deform said contact surfaces having asperities against said first and second surfaces;

applying a light source to at least one end of said first surface with contact surfaces deformed for reflecting said asperities;

locating an optical microscope substantially perpendicular over said first surface with said light reflecting said asperities for imaging said light reflected from said asperities; and reversing said first and second surfaces and said carrier means for applying said light source to at least one end of said second surface with said contact surfaces deformed for reflecting said asperities.

21. A technique for imaging a member having a surface formed of conductive particles, said surface having asperities in a first direction that are relatively small compared to another dimension of said surface, the technique comprising:

locating said asperities of said surface against a first surface of predetermined length and width with at least one edge and formed of a predetermined transparent material;

pressing said asperities of said surface against said transparent surface;

applying a light source to at least one end of said transparent surface for reflecting from said asperities; and imaging said light reflected from said asperities for study.

22. A technique for imaging a member having a surface, as defined by claim 21, including using means to compress said member a predetermined amount.

23. A technique for imaging a member having a surface, as defined by claim 21, including using a second surface having asperities in a first direction that are relatively small compared to another dimension of said surface; locating said asperities of said second surface against a second transparent surface of predetermined length and width.

* * * * *